(12) United States Patent
Nakahara

(10) Patent No.: US 12,051,636 B2
(45) Date of Patent: Jul. 30, 2024

(54) POWER MODULE

(71) Applicant: Mitsubishi Electric Corporation, Tokyo (JP)

(72) Inventor: Kenta Nakahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 349 days.

(21) Appl. No.: 17/632,164

(22) PCT Filed: Oct. 16, 2019

(86) PCT No.: PCT/JP2019/040555
§ 371 (c)(1),
(2) Date: Feb. 1, 2022

(87) PCT Pub. No.: WO2021/074980
PCT Pub. Date: Apr. 22, 2021

(65) Prior Publication Data
US 2022/0285243 A1  Sep. 8, 2022

(51) Int. Cl.
*H01L 23/373* (2006.01)
*H01L 23/367* (2006.01)
(Continued)

(52) U.S. Cl.
CPC ........ *H01L 23/373* (2013.01); *H01L 23/3675* (2013.01); *H01L 23/3735* (2013.01);
(Continued)

(58) Field of Classification Search
CPC ............... H01L 23/373; H01L 23/3675; H01L 23/3735; H01L 23/3121; H01L 25/18;
(Continued)

(56) References Cited

U.S. PATENT DOCUMENTS

2004/0012099 A1* 1/2004 Nakayama .......... H01L 23/4334
257/E23.101
2012/0032350 A1* 2/2012 Warren .................. H01L 24/49
257/782
(Continued)

FOREIGN PATENT DOCUMENTS

JP  2017-059606 A  3/2017
JP  2017-108046 A  6/2017
JP  2019-096731 A  6/2019

OTHER PUBLICATIONS

International Search Report issued in PCT/JP2019/040555; mailed Dec. 24, 2019.

*Primary Examiner* — Peniel M Gumedzoe
(74) *Attorney, Agent, or Firm* — Studebaker & Brackett PC

(57) ABSTRACT

It is an object of the present invention to improve a heat radiation property of a metal wire on a semiconductor chip in a power module. A power module includes: a plurality of metal wires connected to a surface of at least one semiconductor chip; and a thermal conductive sheet having contact with the metal wire. The metal wire includes: at least one first metal wire connecting a surface of the semiconductor chip and a circuit pattern and at least one second metal wire connecting two points on the surface of the semiconductor chip and having the same potential as the first metal wire. The thermal conductive sheet includes a graphite sheet, and a sheet surface of the thermal conductive sheet has contact with the at least one first metal wire and the at least one second metal wire.

5 Claims, 6 Drawing Sheets

(51) Int. Cl.
  *H01L 25/18* (2023.01)
  *H01L 23/00* (2006.01)
  *H01L 23/31* (2006.01)

(52) U.S. Cl.
  CPC .......... *H01L 25/18* (2013.01); *H01L 23/3121* (2013.01); *H01L 24/48* (2013.01); *H01L 24/49* (2013.01); *H01L 2224/48091* (2013.01); *H01L 2224/48101* (2013.01); *H01L 2224/48106* (2013.01); *H01L 2224/48108* (2013.01); *H01L 2224/48137* (2013.01); *H01L 2224/48229* (2013.01); *H01L 2224/49175* (2013.01)

(58) Field of Classification Search
  CPC ..................... H01L 24/48; H01L 24/49; H01L 2224/48091; H01L 2224/48101; H01L 2224/48106; H01L 2224/48108; H01L 2224/48137; H01L 2224/48229; H01L 2224/49175
  See application file for complete search history.

(56) References Cited

U.S. PATENT DOCUMENTS

| | | | |
|---|---|---|---|
| 2012/0061816 A1* | 3/2012 | Song | .................. H01L 23/3677 257/E23.079 |
| 2017/0170095 A1 | 6/2017 | Matsubara | |
| 2019/0157178 A1 | 5/2019 | Orimoto | |

\* cited by examiner

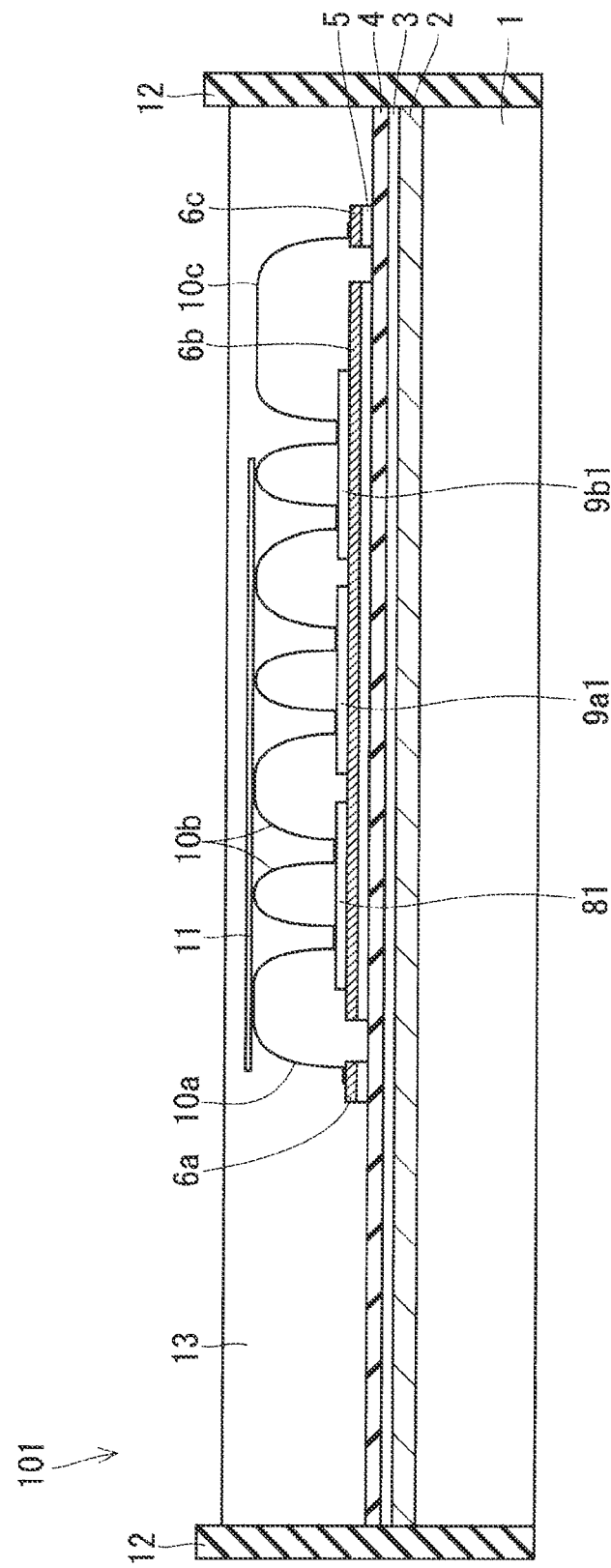
F I G. 1

POWER MODULE

TECHNICAL FIELD

The present invention relates to improvement of a heat radiation property in a power module.

BACKGROUND ART

Conventionally, wiring on a semiconductor chip is performed by bonding using a metal wire in a power module. When the metal wire is used for the wiring on the semiconductor chip, various types of semiconductor chip in which a size or an electrode shape of the semiconductor chip is changed can be deployed in the same package by changing a shape of the wiring.

Patent Document 1 discloses a technique of increasing a heat radiation property in a joint on a lower side of a semiconductor chip. Patent Document 2 discloses a technique of increasing a heat radiation property of a sealing material.

PRIOR ART DOCUMENTS

Patent Documents

Patent Document 1: Japanese Patent Application. Laid-Open No, 2019-096731

Patent Document 2: Japanese Patent Application Laid-Open No. 2017-108046

SUMMARY

Problem to be Solved by the Invention

A temperature of a wire distribution increases when current is applied to the power module due to increase in current or downsizing of the power module. When the temperature of the wire distribution increases, there is a problem that a lifetime of the semiconductor chip and a wire bonding joint is reduced by a temperature cycle of heat generation and cooling, or the wire distribution itself is melted and disconnected.

The present invention therefore has been made to solve the above problems, and it is an object of the present invention to improve a heat radiation property of a metal wire on a semiconductor chip in a power module.

Means to Solve the Problem

A power module according to the present invention includes: a base plate; an insulating substrate provided on the base plate and having at least one circuit pattern; at least one semiconductor chip mounted on the circuit pattern of the insulating substrate; a plurality of metal wires connected to a surface of the semiconductor chip; and a thermal conductive sheet having contact with the metal wire from an upper side, wherein the metal wire includes: at least one first metal wire connecting a surface of the semiconductor chip and the circuit pattern; and at least one second metal wire connecting two points on the surface of the semiconductor chip and having identical potential with the first metal wire, the thermal conductive sheet includes a graphite sheet, and a sheet surface of the thermal conductive sheet has contact with the at least one first metal wire and the at least one second metal wire.

Effects of the Invention

In the power module of the present invention, the sheet surface of the thermal conductive sheet including the graphite sheet has contact with at least one first metal wire and at least one second metal wire. Accordingly, heat of the second metal wire is transmitted to the first metal wire via the graphite sheet to radiate the heat from the first metal wire to the circuit pattern, thus increase in temperature of the second metal wire can be prevented. In this manner, the heat radiation property of the metal wire on the semiconductor chip is improved. These and other objects, features, aspects and advantages of the present invention will become more apparent from the following detailed description of the present invention when taken in conjunction with the accompanying drawings.

BRIEF DESCRIPTION OF DRAWINGS

FIG. 1 A cross-sectional view of a power module according to an embodiment 1.

DESCRIPTION OF EMBODIMENT(S)

A. Embodiment 1

Figure 2:
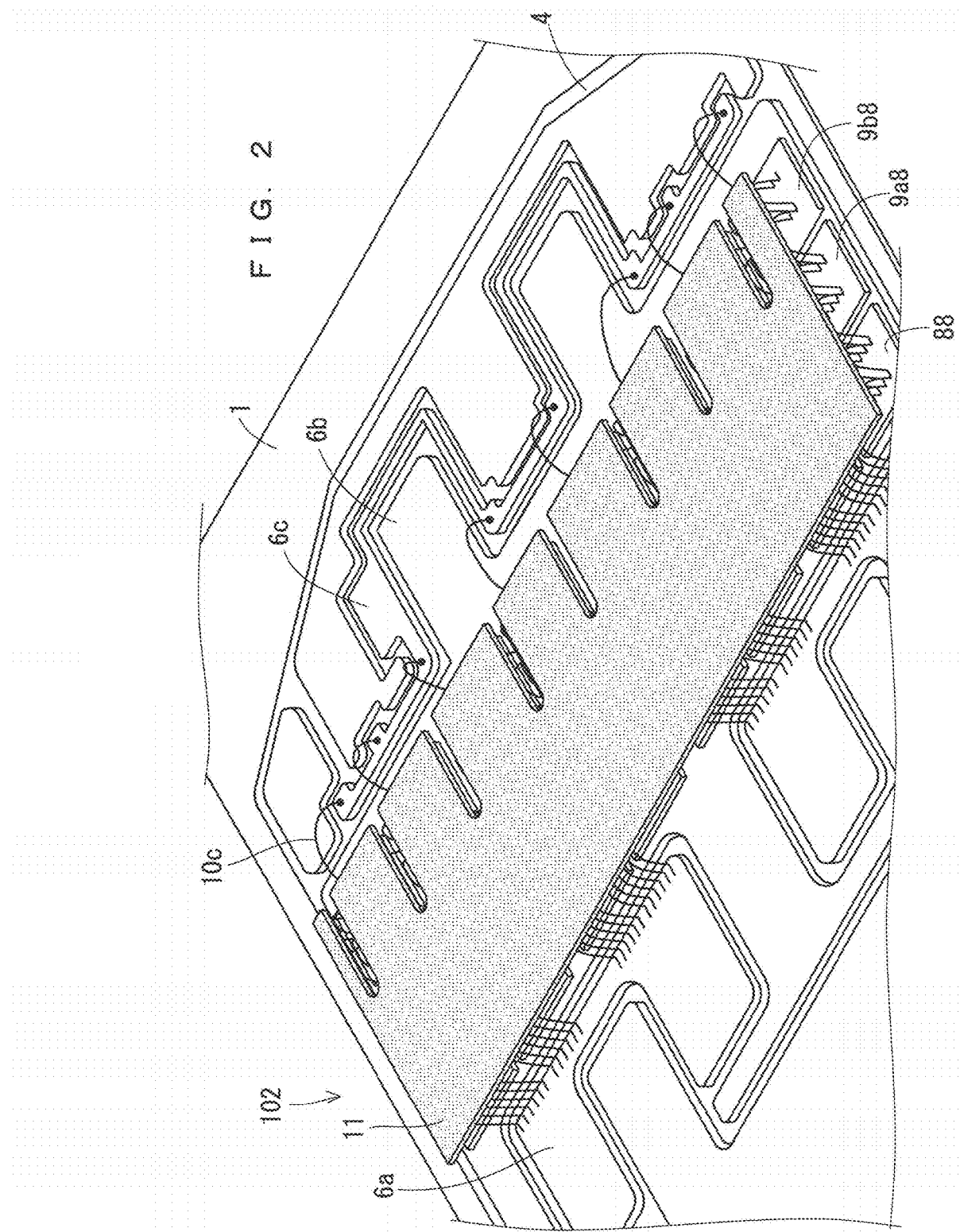
FIG. 2 An isometric drawing of a power module according to an embodiment 2.

FIG. 1 is a cross-sectional view of a power module 101 according to an embodiment 1. The power module 101 includes a base plate 1, an insulating substrate 7, a diode chip 81, transistor chips 9a1 and 9b1, metal wires 10a, 10b, and 10c, a graphite sheet 11, a case 12, and a sealing material 13.

The insulating substrate 7 is formed on an upper surface of the base plate 1. The insulating substrate 7 includes an insulating base material 4, a lower surface pattern 2 made of metal bonded to a lower surface of the insulating base material 4 by a bonding material 3, and circuit patterns 6a, 6b, and 6c made of metal bonded to an upper surface of the insulating base material 4 by a bonding material 5. The lower surface pattern 2 of the insulating substrate 7 is formed on the upper surface of the base plate 1.

The diode chip 81 and the transistor chips 9a1 and 9b1 are bonded on the circuit pattern 6b by soldering or a bonding material such as a sintering material. The diode chip 81 functions as a reflux diode for the transistor chips 9a1 and 9b1. Herein, the diode chip 81 and the transistor chips 9a1 and 9b1 are examples of semiconductor chips. The other semiconductor chip may be mounted on the power module 101 instead of those semiconductor chips, or one semiconductor chip may be mounted thereon.

A wire distribution by a metal wire is performed on an upper surface of the semiconductor chip. A metal wire connecting the diode chip 81 and the circuit pattern 6a in the metal wires connected to the upper surface of the semiconductor chip is referred to as a metal wire 10a. The metal wire 10a is also referred to as a first metal wire. A metal wire connecting two points on the diode chip 81, the diode chip 81 and the transistor chip 9a1, two points on the transistor chip 9a1, the transistor chip 9a1 and the transistor chip 9a2, and two points on the transistor 9a2 is referred to as a metal wire 10b. The metal wire 10b is also referred to as a second metal wire. The transistor chip 9a2 and the circuit pattern 6c, are connected by a metal wire 10c.

The metal wire 10c is a gate wire connecting a gate electrode of the transistor chip 9a2 and the circuit pattern 6c, and has the same potential as the gate electrode (also referred to as "the gate potential" hereinafter). In contrast, the metal wire 10a and the metal wire 10b have the same potential as an emitter electrode of the transistor chip 9a2 (also referred to as "the emitter potential" hereinafter).

The graphite sheet 11 is provided on the metal wires 10a and 10b connected to the upper surface of the semiconductor chip so that a sheet surface thereof has contact with the metal wires 10a and 10b. The graphite sheet 11 is an anisotropic thermal conductive material having a low thermal conductivity of 1 W/mK in a thickness direction and a high thermal conductivity of 500 W/mK or more in a planar direction. Thus, heat of the metal wire 10b is transmitted to the metal wire 10a by the graphite sheet 11, and then radiated from the metal wire 10a to the circuit pattern 6a. Accordingly, a temperature of the metal wire 10b can be reduced. As described above, the graphite sheet 11 in the power module 101 functions as a thermal conductive sheet conducting the heat of the metal wire 10b in a planar direction. The graphite sheet 11 does not have contact with the metal wire 10c by reason that the metal wire 10c has potential different from the metal wires 10a and 10b.

The base plate 1 is fitted to the case 12, and the case 12 houses the base plate 1, the insulating substrate 7, the diode chip 81, the transistor chips 9a1 and 9b1, the metal wires 10a, 10b, and 10c, and the graphite sheet 11. The sealing material 13 made of gel or epoxy resin fills an inner portion of the case 12, and the sealing material 13 seals the diode chip 81, the transistor chips 9a1 and 9b1, the metal wires 10a, 10b, and 10c, and the graphite sheet 11.

In FIG. 1, the graphite sheet 11 has contact with all the metal wires 10b, however, a heat radiation effect described above can be obtained as long as the graphite sheet 11 has contact with the metal wire 10a and at least one metal wire 10b having the same potential as the metal wire 10a. As the number of the metal wires 10b with which the graphite sheet 11 has contact increases, more heat of the metal wire 10b can be radiated to the circuit pattern 6a.

Conventionally, heat on the semiconductor chip of the power module is transmitted to the base plate 1 via a joint below the semiconductor chip, and radiated from the base plate 1 to a cooling fin. However, when current applied to the power module increases, a temperature of the metal wire gets high due to heat transmission from the semiconductor chip or heat generation caused by current conduction in the metal wire itself. In contrast, in the power module 101 according to the embodiment 1, the heat of the metal wire 10b is radiated in a direction parallel to a surface of the base plate 1 by the graphite sheet 11, thus increase in temperature of the metal wire 10b is reduced.

As described above, the power module 101 according to the embodiment 1 includes the base plate 1, the insulating substrate 7 provided on the base plate 1 and having the circuit patterns 6a, 6b, and 6c, the diode chip 81 and the transistor chips 9a1 and 9b1 as the semiconductor chips mounted on the circuit pattern 6b of the insulating substrate 7, the plurality of metal wires connected to the surface of the semiconductor chip, and the thermal conductive sheet having contact with the metal wire from an upper side. The metal wire includes the metal wire 10a as at least one first metal wire connecting the surface of the diode chip 81 and the circuit pattern 6a and the metal wire 10b as at least one second metal wire connecting two points on the surface of the semiconductor chip and having the same potential as the metal wire 10a. The thermal conductive sheet includes the graphite sheet 11, and the sheet surface of the thermal conductive sheet has contact with at least one metal wire 10a and at least one metal wire 10b. Accordingly, the heat of the metal wire 10b is transmitted to the metal wire 10a via the graphite sheet 11 and radiated from the metal wire 10a to the circuit pattern 6a, thus increase in temperature of the metal wire 10b can be prevented.

B. Embodiment 2

Figure 3:
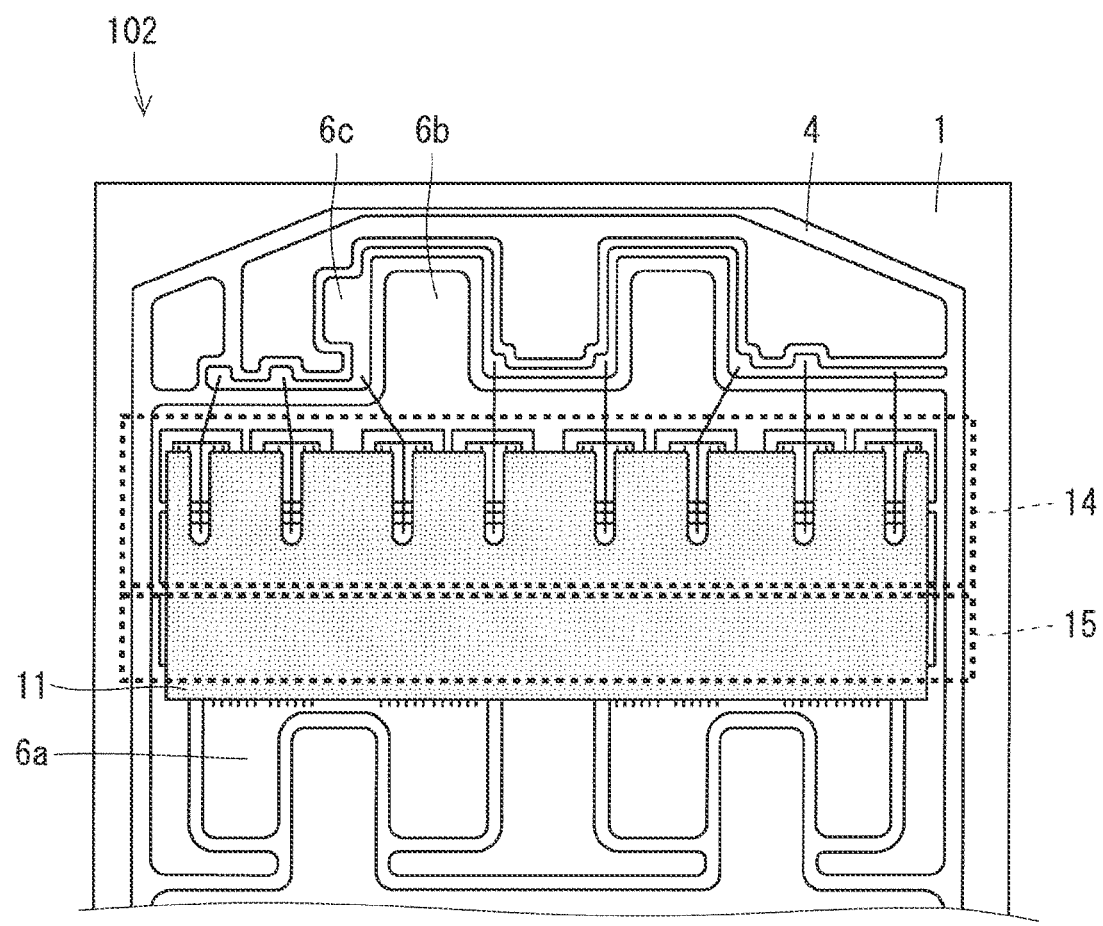
FIG. 3 A top view of the power module according to the embodiment 2.

FIG. 2 is an isometric drawing of a power module 102 according to an embodiment 2. FIG. 3 is a top view of the power module 102, FIG. 4 is an isometric drawing illustrating a state before the graphite sheet 11 of the power module 102 is disposed.

The power module 102 includes diode chips 82 to 88 and transistor chips 9a2 to 9a8 and 9b2 to 9b8 in addition to the configuration of the power module 101 according to the embodiment 1. In other words, eight groups of semiconductor chip made up of one diode chip 8n and two transistor chips 9an and 9bn are parallelly mounted on the power module 102. "n" indicates a natural number of 1 to 8. A connection state of the metal wire in each group of semiconductor chip is the same as each other. The transistor chip is disposed in a region 14 in FIG. 13, and the diode chip is disposed in a region 15.

Figure 4:
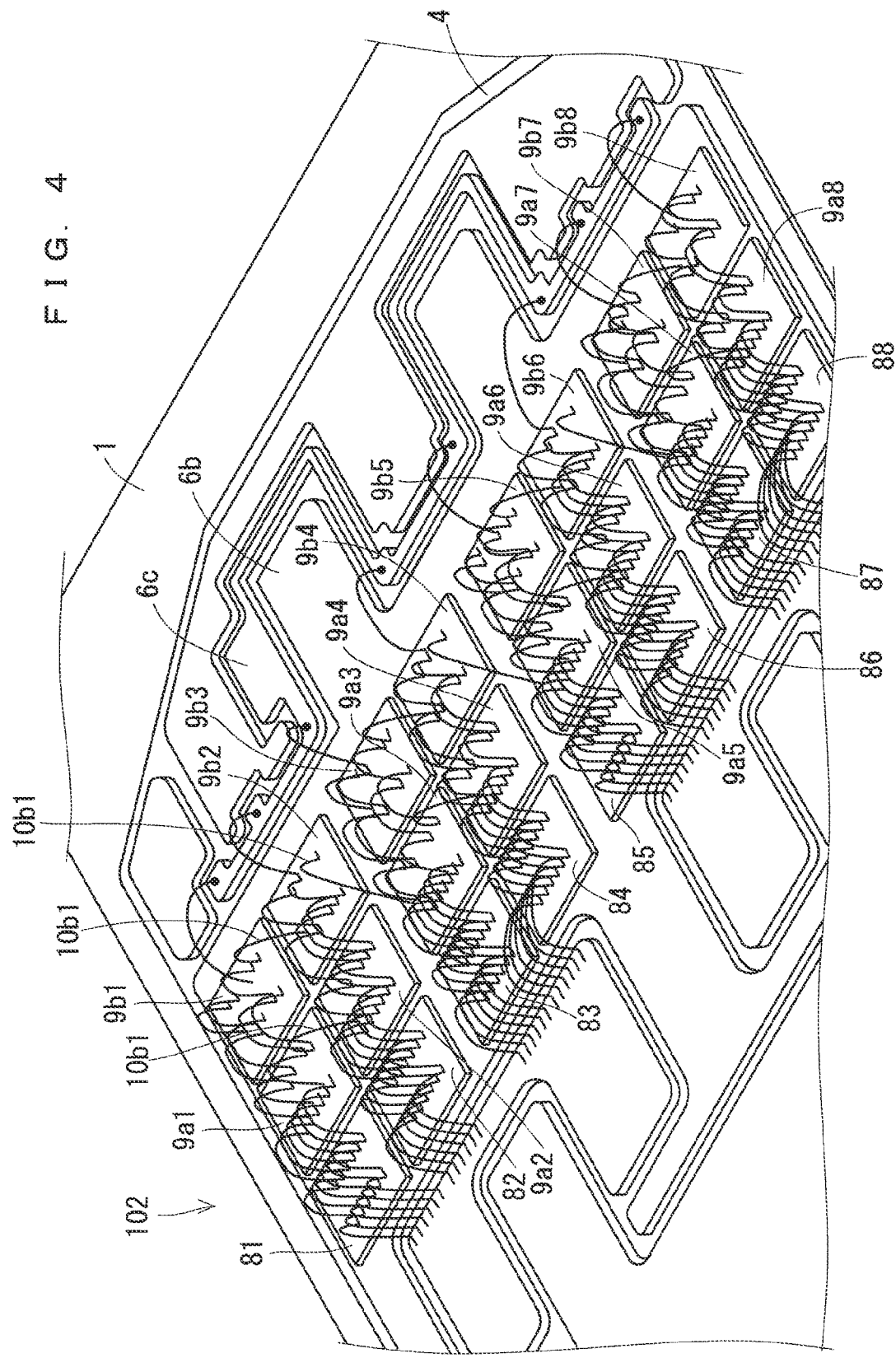
FIG. 4 An isometric drawing of the power module according to the embodiment 2 from which a graphite sheet is excluded.

In FIG. 2 to FIG. 4, the metal wires 10a and 10b are illustrated as a ribbon wire, however, one thread wire may also be applicable. The thread wire has less limitation to a chip size than the ribbon wire, and can be bonded in an oblique direction.

The diode chip 8n functions as a reflux diode for the transistor chips 9an and 9bn. The configuration that the semiconductor chips are parallelly mounted is indicated by the illustration in FIG. 4 where the metal wire 10c as a gate wire is connected to each of the transistor chips 9a1 to 9a8 from the same circuit pattern 6c.

The plurality of semiconductor chips parallelly mounted are connected by the metal wire to form an electrical circuit. For example, in FIG. 4, the transistor chip 9b1 and the transistor chip 9b2 are connected by the metal wire 10b1, and the transistor chip 9b2 and the transistor chip 9a3 are connected by the metal wire 10b1. These metal wires 10b1 have the same potential as the metal wire 10a, and are also referred to as the second metal wires in the manner similar to the metal wire 10b. Current is applied to the plurality of semiconductor chips parallelly mounted at the same time, and large current can be applied to the power module 102. However, heat is generated in a bonding point in the metal wire 10b1 described above by reason that current is applied to the semiconductor chips at both ends at the same time, thus when current is applied to the metal wire 10b1 itself, the temperature of the metal wire 10b1 is higher than a region on the semiconductor chip.

In this point, the graphite sheet 11 in the power module 102 is formed on an upper portion of the metal wire 10b1 connecting the group of the transistor chips 9a1 and 9b1 and the diode chip 81 and the group of the transistor chips 9a2 and 9b2 and the diode chip 82 to have contact with the metal wire 10b1 in addition to the feature in the embodiment 1.

As described above, the power module 102 according to the embodiment 2 includes the transistor chips 9b1 to 9b8 as the plurality of semiconductor chips in which a gate terminal as a control terminal is connected to the same circuit pattern 6a or the circuit pattern having the same potential, and the sheet surface of the thermal conductive sheet has contact with the metal wire 10b1 as the second metal wire connecting the transistor chips 9b1 to 9b8. Current is applied to the semiconductor chips 9b1 to 9b8 at both ends of the metal wire 10b1 at the same time, and the semiconductor chips 9b1 and 9b8 generate heat, thus the temperature of the metal wire 10b1 is higher than a region on the semiconductor chips 9b1 to 9b8 in some cases. However, the heat of the metal wire 10b1 is transmitted to the metal wire 10a via the graphite sheet 11 and radiated from the metal wire 10a to the circuit pattern 6a, thus increase in temperature of the metal wire 10b1 can be suppressed. Accordingly, a product lifetime of the power module 102 can be extended.

C. Embodiment 3

Figure 5:
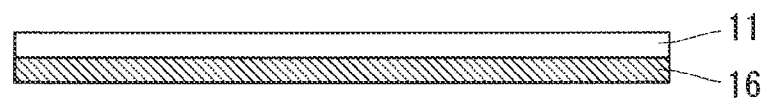
FIG. 5 A drawing illustrating a configuration of a then al conductive sheet in a power module according to an embodiment 3.

In the power modules 101 and 102 according to the embodiments 1 and 2, the thermal conductive sheet is made up of a single graphite sheet 11. In the meanwhile, in a power module according to the embodiment 3, as illustrated in FIG. 5, a thermal conductive sheet is made up of a clad material in which the graphite sheet 11 and a metal thin film 16 are overlapped with each other as illustrated in FIG. 5. FIG. 5 illustrates the metal thin film 16 as a lower layer and the graphite sheet 11 as an upper layer, however, it is also applicable that the graphite sheet 11 is a lower layer and the metal thin film 16 is an upper layer. A configuration of the power module according to the embodiment 3 is similar to the power modules 101 and 102 according to embodiment 1 or 2 except for the thermal conductive sheet.

The graphite sheet 11 has low strength of material and is fragile, thus if the thermal conductive sheet is made up of the single graphite sheet 11, a state thereof is changed in handling at a time of processing a shape or assembly, thus there is concern that yield in assembling products is reduced. When the thermal conductive sheet is made up of the clad material in which the graphite sheet 11 and the metal thin film 16 are overlapped with each other, the shape of the thermal conductive sheet can be processed or the thermal conductive sheet can be assembled while keeping large strength caused by the metal thin film 16. Heat generation of the metal wires 10b and 10b1 is suppressed by the high thermal conductivity in a planar direction caused by the graphite sheet 11.

It is preferable that a thickness of the metal thin film 16 is 100 μm, and a thickness of the graphite sheet 11 is equal to or larger than 100 μm and equal to or smaller than 400 μm. In this manner, the thermal conductive sheet has an appropriate thickness, thus change in a shape or placement in accordance with the wiring material can be easily performed.

D. Embodiment 4

Figure 6:
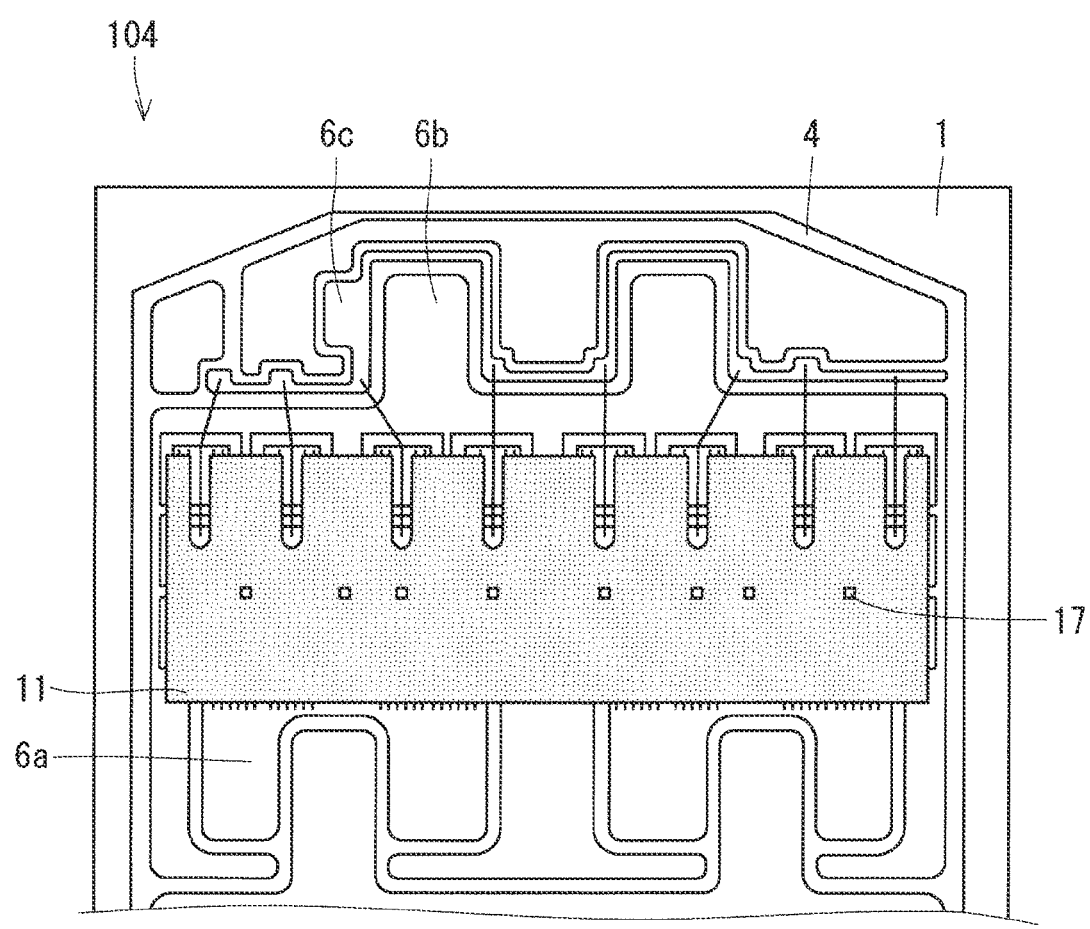
FIG. 6 A top view of a power module according to an embodiment 4.

FIG. 6 is a top view of a power module 104 according to an embodiment 4. The power module 104 according to the embodiment 4 is different from the power module 102 according to the embodiment 2 in that a hole 15 passing through the sheet surface of the graphite sheet 11 is formed in the graphite sheet 11. Eight holes 15 are formed in FIG. 6, however, it is sufficient that at least one hole 15 is formed.

The sealing material 13 fills the case 12 as illustrated in FIG. 1 in forming the power module 104. When the hardened sealing material includes an air bubble therein, an insulation quality of the power module is reduced depending on a position where the air bubble occurs in the power module 104, the air bubble occurring between the graphite sheet 11 and the semiconductor chip can be extracted to an upper side of the graphite sheet 11 by the hole 15 of the graphite sheet 11, and can be further extracted from the sealing material 13. A diameter of the hole 15 is preferably equal to or larger than 1.0 mm to extract the air bubble. An outer periphery of the hole 15 is preferably 1.0 mm or more away from a position having contact with the metal wires 10a and 10b of the graphite sheet 11. When the hole 15 is disposed in a position where the air bubble particularly tends to remain, an effect of extracting the air bubble is obtained easily.

The present embodiment may be combined with the embodiment 3. That is to say, it is also applicable in the present embodiment that the thermal conductive sheet is made up of a clad material of the graphite sheet 11 and the metal thin film 16, and the hole 15 passing through the graphite sheet 11 and the metal thin film 16 is formed in the sheet surface of the thermal conductive sheet. In this case, the thermal conductive sheet has high strength caused by the metal thin film 16, thus the processing of the hole 15 is easily performed, and failure of a member itself can be suppressed.

That is to say, the power module 104 according to the embodiment 4 includes the case 12 fitted to the base plate 1 and housing the insulating substrate 7, the semiconductor chips 81, 9a1, and 9b1, the metal wires 10a and 10b, and the thermal conductive sheet and the sealing material 13 filling the inner portion of the case 12 to seal the semiconductor chip, the metal wires 10a and 10b, and the thermal conductive sheet, and the hole 15 passing through the sheet surface is formed in a position in the thermal conductive sheet not overlapping with the metal wires 10a and 10b. Accordingly, the air bubble occurring between the graphite sheet 11 and the semiconductor chip and having influence on the insulation quality of the power module can be extracted to the upper side of the graphite sheet 11, and can be further extracted from the sealing material 13.

According to the present invention, each embodiment can be arbitrarily combined, or each embodiment can be appropriately varied or omitted within the scope of the invention. The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 base plate,
2 lower surface pattern,
3, 5 bonding material,
4 insulating base material,
6a, 6b, 6c circuit pattern,
7 insulating substrate,
9a1 to 9a8, 9b1 to 9b8 transistor chip,
10a, 10b, 10b1, 10c metal wire,
11 graphite sheet,
12 case,
13 sealing material,
16 metal thin film, 17 hole,
81-88 diode chip,
101, 102, 104 power module.

The invention claimed is:

1. A power module, comprising:
a base plate;
an insulating substrate provided on the base plate and having at least one circuit pattern;
at least one semiconductor chip mounted on the circuit pattern of the insulating substrate;
a plurality of metal wires connected to a surface of the semiconductor chip; and
a thermal conductive sheet having contact with the plurality of metal wires from an upper side, wherein
the plurality of metal wires includes:
at least one first metal wire connecting a surface of the semiconductor chip and the circuit pattern; and
at least one second metal wire connecting two points on the surface of the semiconductor chip and having identical potential with the first metal wire,
the thermal conductive sheet includes a graphite sheet, and
a sheet surface of the thermal conductive sheet has contact with the at least one first metal wire and the at least one second metal wire.

2. The power module according to claim 1, wherein
the semiconductor chip includes a plurality of semiconductor chips in which control terminals are connected to the circuit patterns identical with each other or the circuit patterns having identical potential with each other, and
a sheet surface of the thermal conductive sheet has contact with the second metal wire connecting the plurality of semiconductor chips.

3. The power module according to claim 1, wherein
the thermal conductive sheet is a clad material in which a metal thin film and the graphite sheet are overlapped with each other.

4. The power module according to claim 3, wherein
a thickness of the metal thin film is 100 μm, and
a thickness of the graphite sheet is equal to or larger than 100 μm and equal to or smaller than 400 μm.

5. The power module according to claim 1, further comprising:
a case fitted to the base plate and housing the insulating substrate, the semiconductor chip, the plurality of metal wires, and the thermal conductive sheet; and
a sealing material filling an inner portion of the case to seal the semiconductor chip, the plurality of metal wires, and the thermal conductive sheet, wherein
a hole passing through the sheet surface is formed in a position in the thermal conductive sheet not overlapping with the plurality of metal wires.

* * * * *